(12) United States Patent
Dobler et al.

(10) Patent No.: US 6,788,548 B2
(45) Date of Patent: Sep. 7, 2004

(54) ADAPTER APPARATUS FOR MEMORY MODULES

(75) Inventors: Manfred Dobler, München (DE); Thomas Huber, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/377,349

(22) Filed: Feb. 28, 2003

(65) Prior Publication Data

US 2003/0161125 A1 Aug. 28, 2003

(30) Foreign Application Priority Data

Feb. 28, 2002 (DE) .......................................... 102 08 737

(51) Int. Cl.[7] .................................................. H05K 7/02
(52) U.S. Cl. .......................................... 361/777; 365/63
(58) Field of Search ................................. 361/733, 760, 361/765, 772, 777, 785, 788, 792, 802, 791, 803; 439/55, 59, 60, 61, 65; 365/51, 52, 63

(56) References Cited

U.S. PATENT DOCUMENTS

| | | | |
|---|---|---|---|
| 6,004,139 A | 12/1999 | Dramstad et al. | |
| 6,034,878 A | * 3/2000 | Osaka et al. | 365/52 |
| 6,092,146 A | 7/2000 | Dell et al. | |
| 6,108,730 A | * 8/2000 | Dell et al. | 710/301 |
| 6,477,614 B1 | * 11/2002 | Leddige et al. | 711/5 |
| 6,585,525 B2 | * 7/2003 | Jung et al. | 439/55 |
| 2002/0032836 A1 | * 3/2002 | Tseng | 711/115 |

* cited by examiner

*Primary Examiner*—David Martin
*Assistant Examiner*—Thanh S. Phan
(74) *Attorney, Agent, or Firm*—Laurence A. Greenberg; Werner H. Stemer; Ralph E. Locher

(57) ABSTRACT

An adapter apparatus for receiving memory modules, each of which has a plurality of data terminals and a plurality of control terminals, comprises first data terminals, first control terminals, a first socket for receiving a first memory module with second data terminals and second control terminals, wherein the second data terminals are associated to the data terminals of the first memory module, wherein the second control terminals are associated to the control terminals of the first memory module, a second socket for receiving a second memory module with third data terminals and third control terminals, wherein the third data terminals are associated to the data terminals of the second memory module, wherein the third control terminals are associated to the control terminals of the second memory module, a signal transformation circuit with an input and an output, wherein the input is connected to the first control terminals, and wherein the output is connected to the second control terminals and to the third control terminals, and wherein a second group of first data terminals is connected to the third data terminals.

9 Claims, 2 Drawing Sheets

ADAPTER APPARATUS FOR MEMORY MODULES

FIELD OF THE INVENTION

The present invention refers to an adapter apparatus for receiving memory modules.

BACKGROUND OF THE INVENTION AND PRIOR ART

Personal computers, workstations and servers usually have one or several sockets for receiving memory modules. A memory module is a small board with a plurality of data terminals and a plurality of control terminals and carries one or several RAM devices. The RAM devices of memory modules, which are inserted into sockets of a computer, form together the working memory of the computer. To extend the working memory or to increase its capacity, respectively, additional memory modules can be inserted into free sockets or already existing memory modules can be replaced by memory modules with higher capacity.

In recent years, a standard for memory modules has gained acceptance and found wide distribution, which is generally known by the abbreviation DIMM (DIMM=dual inline memory module). DIMM memory modules from different manufacturers can be used almost arbitrarily in DIMM sockets of computers from different manufacturers, since number, shape and arrangement of data terminals and control terminals, time profiles and levels of data and control signals to be exchanged, a protocol for the transmission of important parameters of a memory module to the computer, etc. are specified.

A user of a computer has advantage that he can change the size of the working memory of the computer and can choose between the products of different manufacturers when buying memory modules.

Different manufacturers offer workstations and servers, which do not use the DIMM standard, but instead customized memory modules, so-called server DIMM memory modules or briefly, "server DIMMs". For example, a customized server DIMM memory module differs significantly from a standard DIMM memory module in the architecture, in the applied signals and their timing. The most important differences are listed below:

Standard and commodity DIMM memory modules, respectively, have 72 IO channels and input/output terminals, respectively, and data terminals, respectively, as well as various control terminals, terminals for supplying a supply voltage and ground terminals (GND=ground), for example a total of 168 pins and terminals, respectively, for a single data rate (SDR) or 184 pins for a double data rate (DDR). Customized server DIMM memory modules have, for example, the double IO width, i.e. 144 data terminals, various control terminals, terminals for one or several supply voltages, a ground terminal and, for example, a total of 232 terminals.

The DIMM standard provides a LVCMOS clock for SDR, which is transmitted from the computer to the memory module to clock the exchange of data and control signals. In a server DIMM memory module, however, a differential LVPECL clock is provided.

Contrary to standard DIMM memory modules, on server DIMM memory modules, a buffer and a latch, respectively, is provided for addresses, instructions and other control signals to minimize the input capacities for the respective signals. Due to the delayed effect of the latch on the signals, the memory controller provides a timing shifted towards the setup side.

Due to the described differences, it has so far not been possible to use standard DIMM memory modules in computers with server DIMM sockets. This results leads to several disadvantages for the user of such a device. Particularly, the user cannot fall back on the cost effective and easily available standard DIMM memory modules, but is dependent on buying server DIMM memory modules, which are produced in much smaller numbers and are distributed by a much smaller number of computer accessory dealers. Accordingly, the prices of server DIMM memory modules are significantly higher than the prices of standard DIMM memory modules. Additionally, standard DIMM memory modules are usually available much earlier than customized modules, such as the server DIMM memory module. Thus, a user of a computer with server DIMM sockets can use memory modules or memory devices of a new shrink generation only later than a user of a computer with standard DIMM sockets.

Although the described problems have a significant practical relevance for users of computers with server DIMM sockets, so far no solution is known.

SUMMARY OF THE INVENTION

It is the object of the present invention to provide an apparatus, which enables the use of memory modules according to a first standard in sockets according to a second standard.

In accordance with a first aspect of the invention, this object is achieved by an adapter apparatus for receiving memory modules, wherein each of the memory modules comprises a plurality of data terminals and a plurality of control terminals, comprising: first data terminals and first control terminals; a first socket for receiving a first memory module with second data terminals and second control terminals, wherein the second data terminals are associated to the data terminals of the first memory module, wherein the second control terminals are associated to the control terminals of the first memory module; a second socket for receiving a second memory module with third data terminals and third control terminals, wherein the third data terminals are associated to the data terminals of the second memory module, wherein the third control terminals are associated to the control terminals of the second memory module; a signal transformation circuit with an input and an output, wherein the input is connected to the first control terminals, and wherein the output is connected to the second control terminals and to the third control terminals, wherein a first group of first data terminals is connected to the second data terminals, and wherein a second group of first data terminals is connected to the third data terminals.

The present invention provides an adapter apparatus for receiving memory modules, wherein each of the memory modules comprises a plurality of data terminals and a plurality of control terminals. The adapter apparatus comprises first data terminals, first control terminals and a first socket for receiving first memory modules with second data terminals and second control terminals, wherein the second data terminals are associated to the data terminals of the first memory modules, and wherein the second control terminals are associated to the control terminals of the first memory modules. Further, the adapter apparatus comprises a second socket for receiving a second memory module with third data terminals and third control terminals, wherein the third data terminals are associated to the data terminals of the second memory module, and wherein the third control terminals are associated to the control terminals of the second memory modules. Further, the adapter apparatus comprises a signal transformation circuit with an input and an output, wherein the input is connected to the first control terminals, and wherein the output is connected to the second control terminals and to the third control terminals. In the adapter apparatus, a first group of first data terminals is connected to the second data terminals, and a second group of first data terminals is connected to the third data terminals.

According to the present invention, memory modules corresponding to a first specification and a first standard, respectively, can be used in a socket corresponding to a second specification and a second standard, respectively. Further, by the present invention, an adaption of the control signals according to the server DIMM specification to the DIMM standard and vice versa is performed in a simple way via a phase locked loop, a latch and an EEPROM. These necessary devices are easily available and enable cost effective production of the adapter apparatus.

It is an advantage of the present invention that it enables a user of an apparatus, such as a computer, with a socket for a memory module with first data terminals and first control terminals, to use memory modules with second data terminals and second control terminals, although the number of first data terminals and the number of second data terminals differ, and although the first control terminals and the second control terminals differ with regard to number, arrangement and the control signals transmitted via them. Thus, the user can fall back on a bigger choice of memory modules and has, if necessary, the possibility to use more powerful and/or less expensive memory modules.

Particularly in the already above-described specific case of the server DIMM sockets of a workstation or a server, the inventive adapter apparatus produces compatibility between standard SDRAM DIMM memory modules on the one hand and the server memory control and the server DIMM socket on the other hand. Additionally, the adapter apparatus has exactly two sockets for the reception of standard DIMM memory modules, whose respective 72 data terminals are combined to 144 data terminals. Thus, standard DIMM memory modules can be used in workstations and servers of the high-end segment. This leads to a cost advantage, since standard DIMM memory modules are available much cheaper than the customized server DIMM memory modules. Further, for analysis purposes, standard DIMM memory modules (such as first modules of a new shrink or a new design level) can be tested in an application of a manufacturer by means of the adapter apparatus, whereby the full functionality in the target system is ensured. Here, the use of the adapter apparatus offers a time advantage, since standard modules are mostly available earlier than customized modules. Further, in reverse engineering and foreign design comparison, standard DIMM memory modules of the competitors can be used. Here, also a time and cost advantage occurs, whereby the adapter apparatus does not cause a performance loss. Respective advantages occur also in the case of different standards and specifications, respectively.

Preferred developments of the present invention are defined in the sub claims.

BRIEF DESCRIPTION OF THE DRAWINGS

Below, preferred embodiments of the present invention will be explained in more detail with reference to the accompanying figures. They show.

DETAILED DESCRIPTION OF PREFERRED EMBODIMENTS

Figure 1:
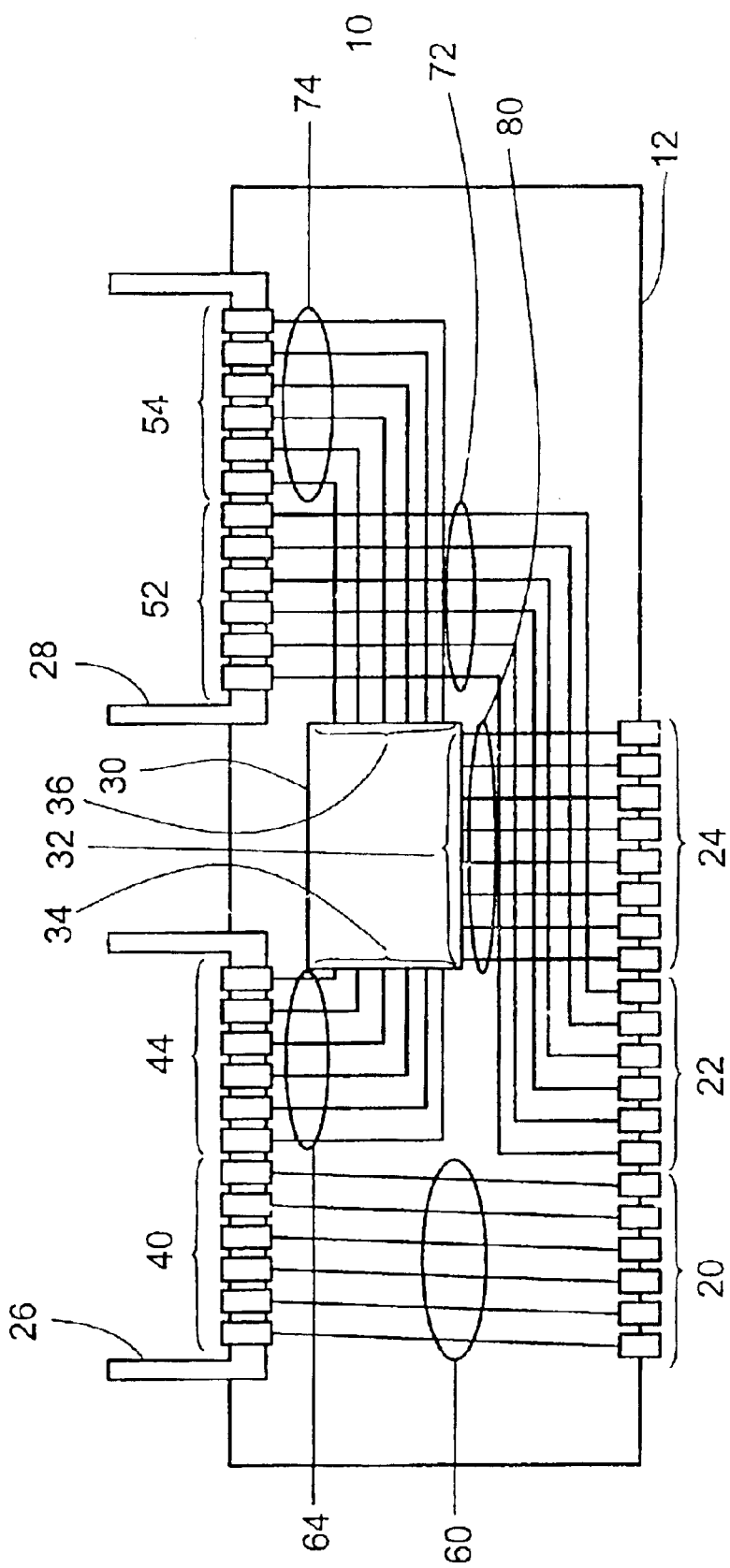
FIG. 1 a schematic representation of a first embodiment of the present invention.

FIG. 1 is a schematic representation of an adapter apparatus according to a first embodiment of the present invention. The adapter apparatus comprises a board 10, at the lower edge 12 thereof, first data terminals 20, 22 and first control terminals 24 are disposed. In the following, the terminals for supplying one or several supply voltages (e.g. VCC; VCC=positive supply voltage) as well as to the connection to ground (GND) are counted to the control terminals. The data terminals 20, 22 and the control terminals 24 are arranged in the shape of a row of electrical contact paths at the edge 12, so that when inserting the board 10 into a corresponding, not illustrated socket of a computer, electrically conductive connections of the data terminals 20, 22 and the control terminals 24 are created with correspondingly disposed contact pins or contact springs on the socket. Further, a first socket 26, a second socket 28 and a signal transformation circuit 30 are disposed on the board 10. The signal transformation circuit 30 comprises an input 32 and an output 34, 36 illustrated in two pieces. The first socket 26 comprises second data terminals 40 and second control terminals 44, which are disposed so that they form electrically conductive connections with correspondingly disposed data terminals and control terminals of a first memory module, which is not illustrated, when the first memory module is inserted into the first socket 26. Accordingly, the second socket 28 has third data terminals 52 and third control terminals 54 and is provided to receive a second memory module.

The second data terminals 40 at the first socket 26 are connected to a first group 20 of the first data terminals 20, 22 via lines 60, the second control terminals 44 at the first socket 26 are connected to the output 34 of the signal transformation circuit 30 via lines 64. The third data terminals 52 at the second socket 28 are connected to a second group 22 of the first data terminals 20, 22 via lines 72, the third control terminals 54 at the second socket 28 are connected to the output 36 of the signal transformation circuit 30 via lines 74. The first control terminals 24 are connected to the input 32 of the signal transformation circuit 30 via lines 80.

While data signals are piped through the adapter apparatus only from the first data terminals 20, 22 to the second and third data terminals 40, 52 or vice versa, control signals are, at least partly, subject to a signal transformation, in the signal transformation circuit 30. Here, particularly levels and phase positions of clocks, address signals and other control signals are changed, to obtain an adaption between a first specification, to which the first control terminals 24 and the control signals transmitted thereby correspond, and a second specification, to which the second control terminals 44 and the third control terminals 54 as well as the control signals to be transmitted over them correspond. For this purpose, further, another adaption can take place in the signal transformation circuit 30, for example control signals, which are provided at the first control terminals 24 whose reception by the memory modules in the sockets 26, 28 is not provided, can be suppressed, or control signals, which are needed from the memory modules inserted in the sockets 26, 28 for a perfect operation, but which are not applied to the first control terminals, can be generated. Further, the signal transformation circuit 30 can logically restructure control signals. Additionally, an adaption of signal impedances is possible. In the easiest case, both sockets 26, 28 and both memory modules inserted into the sockets 26, 28, respectively, receive the same control signals. In this case, the two pieces of the output 34, 36 are identical and connected in parallel within the signal transformation circuit 30, respectively. Alternatively, the signal transformation circuit 30 has only one output in this case, wherein departing from the illustration in FIG. 1, lines from the signal transformation circuit 30 branch outside thereof to the sockets 26, 28 in the shape of a parallel circuit.

Figure 2:
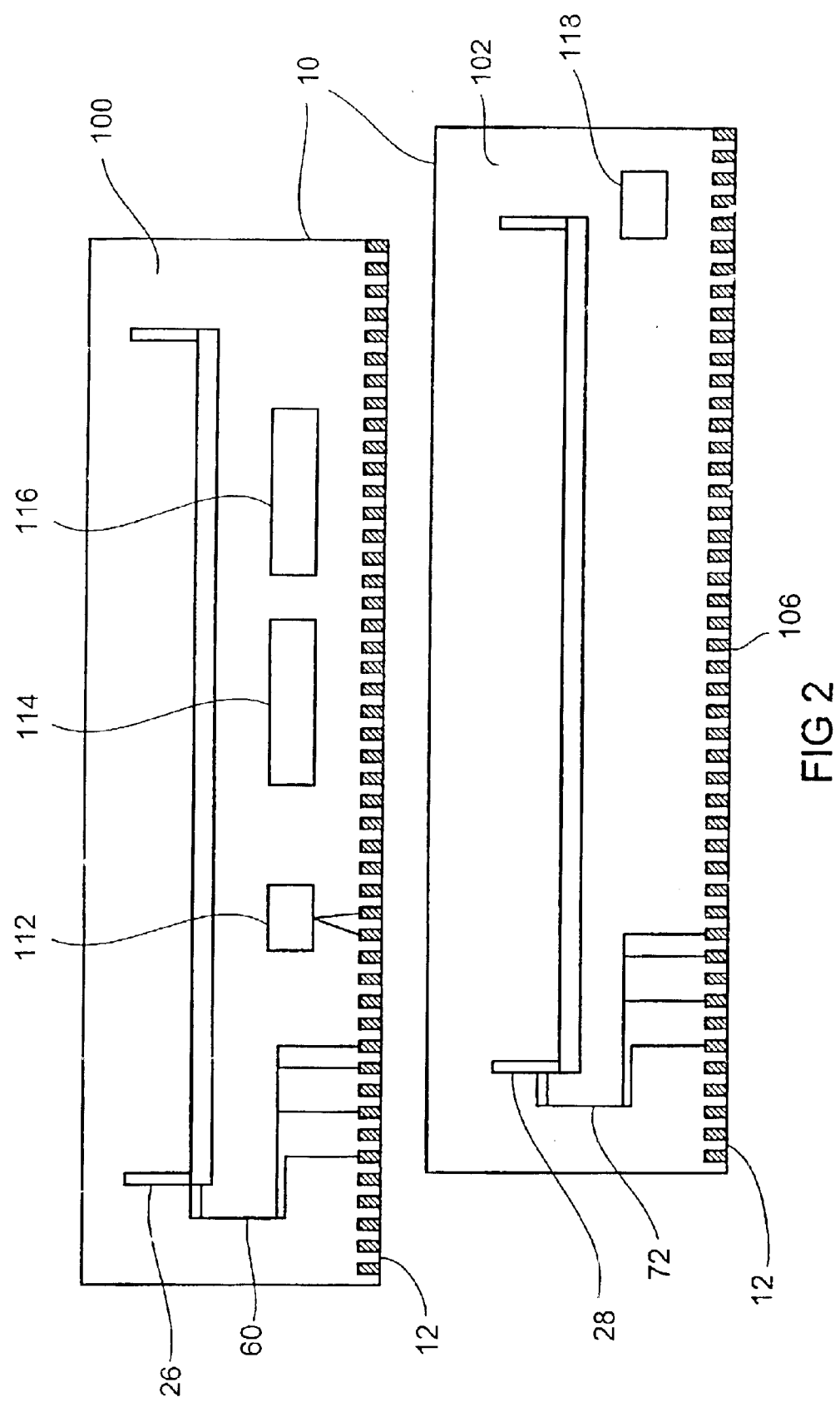
FIG. 2 a schematic representation of a second embodiment of the present invention.

FIG. 2 is a schematic representation of a second embodiment of the present invention, which refers specifically to the use of standard DIMM memory modules in a server DIMM socket of a workstation or a server. In FIG. 2, front face 100 and back face 102 of a board 10 are illustrated above one another, wherein in opposition to FIG. 1, for improved clarity, a representation of terminals and lines is partly omitted. The board 10 has 116 pins and terminals 106, respectively, on one edge 104 on the front face 100 as well as on the back face 102. Out of this total of 232 terminals 106, 144 are data terminals, which correspond to the first data terminals 20, 22 of the first embodiment of FIG. 1. The other 88 terminals 106 are control terminals, which correspond to the first control terminals 24 of the embodiment of FIG. 1, and which particularly transmit the signals RAS (row address strobe), CAS (column address strobe), WE (write enable), CS (column select). Further, the board 10 has a first socket 26 on its front face 100, and a second socket 28 on its back face 102. Both sockets 26, 28 comprise 72 data terminals, not shown, which correspond to the second data terminals 40 and third data terminals 52, respectively, and 96 control terminals, corresponding to the second control terminals 44 and the third control terminals 54, respectively. A first group of 72 data terminals 106 is connected to the 72 data terminals of the first socket 26 via lines 60, a second group of 72 data terminals 106 is connected to the 72 data terminals of the second socket 28 via lines 72.

The first socket 26 and the second socket 28 are each provided to receive a standard DIMM module, preferably a standard SDRAM DIMM module, i.e. a standard DIMM module, which is provided with SDRAM devices (SDRAM=synchronous dynamic random access memory).

Further, the board 10 comprises a phase locked loop 112, two buffers and intermediate buffers 114, 116 on the front face 100, and an EEPROM 118 (EEPROM=electrically erasable programmable read-only memory) on the back face 102. The phase locked loop 112, the latch 114, 116 and the EEPROM 118 are connected, on the one hand, to control terminals 106 and, on the other hand, to control terminals of the first socket 26 and the second socket 28 via lines, which are not illustrated. The phase locked loop 112, the latches 114, 116 and the EEPROM 118 together correspond to the signal transformation circuit 30 of the embodiment illustrated with regard to FIG. 1.

The phase locked loop 112, such as "Motorola MMPC953" is connected to control terminals 106 and control terminals of the sockets 26, 28, across which a clock is transmitted. The phase locked loop serves for the transformation of a LVPECC clock generated by the workstation, which corresponds to a server DIMM specification, into a LVCMOS clock, which can be processed by the standard DIMM memory modules. The phase of the clock signal at the output of the phase locked loop can be shifted against the phase of the clock at the input of the phase locked loop, in order to compensate for signal run times on the adapter apparatus, if necessary.

The two buffers and latches 114, 116, respectively, (for example "IDT 7ALVCH162830") amplify and delay control signals, which are generated by a memory controller of the workstation and are applied to the control terminals 106, before they are passed on to the sockets 26, 28 and the memory modules residing therein, respectively. The time a signal needs to run through the buffer, which means the time between applying a signal to an input of the buffer and the application of the signal (maybe amplified by the buffer) at an output of the buffer is referred to as fly time. A signal running through a buffer is thus delayed by the fly time compared to a signal which is passed on directly. In order to compensate the fly time of the latch 114, 116, the respective signals are sent to the memory module earlier, they are thus shifted towards the set up side. The latches 114, 116 cause particularly that the control signals at the SDRAM devices on the memory modules are applied centered around the raising edge of the clock.

The EEPROM 118 (such as "ATMEL 24C64") ensures the transmission of information and parameters describing the memory modules to the memory control. The transmission of the parameters of the memory modules is performed preferably in a serial way (serial presence detect). Particularly, it enables a transmission of the size, the data width, the speed and the voltage of the memory modules to the memory control. These parameters, which the memory module depends on, can be saved in the EEPROM in the shape of constants. Alternatively, the signal transformation circuit 30 can comprise another input, which is connected to the second and third control terminals 44, 54 of the sockets 26, 28, to receive the respective parameters of the individual memory modules therefrom. The signal transformation circuit 30 calculates parameters from the parameters of the individual memory modules, which are output via another output, connected to the first control terminals 24, to supply them to the memory control.

Departing from the embodiments shown in FIGS. 1 and 2, an inventive adapter apparatus can also comprise more than two sockets 26, 28, such as four or eight sockets for receiving four and eight memory modules, respectively. Thereby, all data terminals of the memory module can be used in parallel, to obtain the fourfold and eightfold width of the data bus, respectively. Alternatively, two or four memory modules can be addressed by different addresses, wherein their data terminals are connected to the same first data terminals of the adapter apparatus by the adapter apparatus. In this way, the adapter apparatus has an address space which is twice and four times, respectively, the size of the address space of every individual memory module. In all cases, further, the numbers of the first, second and third data terminals, the first, second and third control terminals as well as the geometrical form of the adapter apparatus and the arrangement of sockets and memory modules thereon, respectively, depart from the embodiments.

What is claimed is:

1. Adapter apparatus for adapting memory control signals of a first specification to memory control signals of a second specification, the apparatus receiving memory modules, wherein each of the memory modules comprises a plurality of data terminals and a plurality of control terminals, comprising:

first data terminals and first control terminals, the first control terminals receiving memory control signals of the first specification;

a first socket for receiving a first memory module with second data terminals and second control terminals, wherein the second data terminals are associated to the data terminals of the first memory module, wherein the second control terminals are associated to the control terminals of the first memory module, the second control terminals receiving memory control signals of the second specification;

a second socket for receiving a second memory module with third data terminals and third control terminals, wherein the third data terminals are associated to the data terminals of the second memory module, wherein the third control terminals are associated to the control terminals of the second memory module, the third control terminals receiving memory control signals of the second specification;

a signal transformation circuit with an input and an output, wherein the input is connected to the first control terminals, and wherein the output is connected to the second control terminals and to the third control terminals, the signal transformation circuit transforming the memory control signal of the first specification from the first control terminals to the memory control signal of the second specification for the second and third control terminals, wherein a first group of first data terminals is directly connected to the second data terminals, and wherein a second group of first data terminals is directly connected to the third data terminals.

2. Adapter apparatus according to claim 1, wherein the signal transformation circuit comprises a phase locked loop for transforming a first clock signal applied to the input to a second clock signal applied to the output.

3. Adapter apparatus according to claim 1, wherein the signal transformation circuit comprises a latch for latching signals applied to the input.

4. Adapter apparatus according to claim 1, wherein the signal transformation circuit is provided to amplify signals applied to the input and to apply them delayed to the output.

5. Adapter apparatus according to claim 1, wherein the signal transformation circuit further comprises another input connected to the second control terminals and the third control terminals, and another output connected to the first control terminals, and is provided to receive signals at the further input, which shows properties of the first memory module and the second memory module, and to apply signals to the further output, which show the properties of the first memory module and the second memory module.

6. Adapter apparatus according to claim 1, wherein the number of the first data terminals is 144, and the numbers of the second data terminals and the third data terminals are each 72.

7. Adapter apparatus according to claim 6, wherein the first socket and the second socket each correspond to the DIMM standard.

8. Adapter apparatus according to claim 1, wherein the signal transformation circuit also transforms the memory control signal of the second specification from the second and third control terminals to the memory control signal of the first specification for the first control terminals.

9. Adapter apparatus for receiving memory modules, wherein each of the memory modules comprises a plurality of data terminals and a plurality of control terminals, comprising:

first data terminals and first control terminals;

a first socket for receiving a first memory module with second data terminals and second control terminals, wherein the second data terminals are associated to the data terminals of the first memory module, wherein the second control terminals are associated to the control terminals of the first memory module;

a second socket for receiving a second memory module with third data terminals and third control terminals, wherein the third data terminals are associated to the data terminals of the second memory module, wherein the third control terminals are associated to the control terminals of the second memory module;

a signal transformation circuit with an input and an output, wherein the input is connected to the first control terminals, and wherein the output is connected to the second control terminals and to the third control terminals, wherein a first group of first data terminals is connected to the second data terminals, wherein a second group of first data terminals is connected to the third data terminals, and wherein the signal transformation circuit further comprises another input connected to the second control terminals and the third control terminals, and another output connected to the first control terminals, and is provided to receive signals at the further input, which shows properties of the first memory module and the second memory module, and to apply signals to the further output, which show the properties of the first memory module and the second memory module.

* * * * *